US009666449B2

United States Patent
Koval

(10) Patent No.: US 9,666,449 B2
(45) Date of Patent: May 30, 2017

(54) CONDUCTORS HAVING A VARIABLE CONCENTRATION OF GERMANIUM FOR GOVERNING REMOVAL RATES OF THE CONDUCTOR DURING CONTROL GATE FORMATION

(71) Applicant: Randy J. Koval, Boise, ID (US)

(72) Inventor: Randy J. Koval, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 14/291,659

(22) Filed: Jun. 17, 2014

(65) Prior Publication Data

US 2015/0364483 A1 Dec. 17, 2015

(51) Int. Cl.
*H01L 27/11556* (2017.01)
*H01L 21/3213* (2006.01)
*H01L 21/28* (2006.01)
*H01L 21/3205* (2006.01)
*H01L 27/11582* (2017.01)

(52) U.S. Cl.
CPC .. *H01L 21/32133* (2013.01); *H01L 21/28273* (2013.01); *H01L 21/32055* (2013.01); *H01L 21/32134* (2013.01); *H01L 21/32137* (2013.01); *H01L 27/11556* (2013.01); *H01L 21/28282* (2013.01); *H01L 27/11582* (2013.01)

(58) Field of Classification Search
None
See application file for complete search history.

(56) References Cited

U.S. PATENT DOCUMENTS

| | | | |
|---|---|---|---|
| 6,703,277 B1 * | 3/2004 | Paton et al. | 438/287 |
| 2003/0227055 A1 * | 12/2003 | Bae | H01L 21/26586 257/346 |
| 2006/0214217 A1 * | 9/2006 | Watanabe | H01L 27/115 257/315 |
| 2006/0284245 A1 * | 12/2006 | Park et al. | 257/324 |
| 2009/0008705 A1 * | 1/2009 | Zhu et al. | 257/327 |
| 2010/0155810 A1 * | 6/2010 | Kim et al. | 257/316 |
| 2012/0001249 A1 * | 1/2012 | Alsmeier et al. | 257/319 |

OTHER PUBLICATIONS

Chen, Jinghao et al., "Formation of polycrystalline silicon germanium/HfO2 gate stack structure using inductively coupled plasma etching", Journal of Vacuum Science and Technology A, Jul./Aug. 2003, pp. 1210-1217.
Kuo, Po-Yi et al., "Characterstics of Self-Aligned Si/Ge T-Gate Poly-Si Thin-Film Transistors with High On/Off Current Ratio", IEEE Transactions on Electron Devices, Vo. 45, No. 5, May 2007, pp. 1171-1176.

* cited by examiner

*Primary Examiner* — Kimberly Rizkallah
*Assistant Examiner* — Bo Bin Jang
(74) *Attorney, Agent, or Firm* — Dicke, Billig & Czaja, PLLC

(57) ABSTRACT

An embodiment of a method of forming a control gate includes forming a conductor having a concentration of germanium that varies with a thickness of the conductor, and removing portions of the conductor at a variable rate that is governed, at least in part, by the concentration of the germanium.

19 Claims, 11 Drawing Sheets

US 9,666,449 B2

1

CONDUCTORS HAVING A VARIABLE CONCENTRATION OF GERMANIUM FOR GOVERNING REMOVAL RATES OF THE CONDUCTOR DURING CONTROL GATE FORMATION

FIELD

The present disclosure relates generally to, control gate formation, and, in particular, the present disclosure relates to conductors containing a variable concentration of germanium, such as for governing removal rates of the conductor during control gate formation.

BACKGROUND

Control gates may be found in integrated circuit components, such as non-volatile memory cells of flash memory devices and select transistors, such as field effect transistors, e.g., in memory arrays, etc. For example, a non-volatile memory cell, e.g., of a flash memory, such as a NAND flash memory, may include a one-transistor memory cell having a control gate. Changes in threshold voltage of the cells, through programming (which is sometimes referred to as writing) of charge storage structures (e.g., floating gates or charge traps), e.g., capacitively coupled to a control gate, or other physical phenomena (e.g., phase change, resistance change, or polarization) determine the data value of each cell.

An array of memory cells of NAND flash memory may be arranged such that the control gate of each memory cell of a row of the array is connected together to form an access line, such as a word line. Columns of the array include strings (often termed NAND strings) of memory cells connected together in series between a pair of select transistors, e.g., a source select transistor and a drain select transistor. Each source select transistor is connected to a source, while each drain select transistor is connected to a data line, such as column bit line. A "column" refers to a group of memory cells that are commonly coupled to a data line. It does not require any particular orientation or linear relationship, but instead refers to the logical relationship between memory cell and data line.

To meet the demand for higher capacity memories, designers continue to strive to increase memory density, i.e., the number of memory cells in a given area of an integrated circuit die. One way to increase the density of a memory device is to form stacked memory arrays, e.g., often referred to as three-dimensional memory arrays.

For example, some stacked memory arrays might include stacked memory elements, e.g., in the form of vertical strings of series-coupled memory cells (e.g., vertical NAND strings). That is, for example, a vertical string of series-coupled memory cells might be adjacent to a vertical semiconductor, such as a vertical semiconductor pillar, that may act as channel region for the vertical string of memory cells. For example, during operation of one or more memory cells of the string, a channel can be formed in the semiconductor.

The term "vertical" may be defined, for example, as a direction that is perpendicular to a base structure, such as a surface of an integrated circuit die. It should be recognized the term vertical takes into account variations from "exactly" vertical due to routine manufacturing and/or assembly variations and that one of ordinary skill in the art would know what is meant by the term vertical.

A nonvolatile memory cell in a string of series-coupled nonvolatile memory cells may include a charge-storage

2 structure that is capacitively coupled to a control gate (e.g., that may be coupled to or may form a portion of an access line) through a dielectric capacitance. For example, a dielectric (e.g., an inter-dielectric) may be between the control gate and the charge-storage structure.

Performance characteristics of the memory cell may depend on the capacitive coupling between the control gate and the charge-storage structure. For example, increasing the capacitive coupling between the control gate and the charge-storage structure can improve the performance of a memory cell. The capacitive coupling may be increased by increasing the surface area of the surface of the inter-dielectric in contact with the control gate and/or the charge-storage structure, for example. However, it may be difficult to increase the surface area without increasing the size of the memory cell, and thus the memory array.

A capacitive coupling across a gate dielectric between a control gate of a select transistor and the semiconductor that may act as channel region for the vertical string of memory cells might affect the performance characteristics. The capacitive coupling may be increased by increasing the surface area of the gate dielectric in contact with the control gate and/or the semiconductor, for example. However, it may be difficult to increase the surface area without increasing the size of the select transistor, and thus the memory array.

For the reasons stated above, and for other reasons stated below which will become apparent to those skilled in the art upon reading and understanding the present specification, there is a need in the art for alternatives to existing methods of forming control gates.

DETAILED DESCRIPTION

Figure 1:
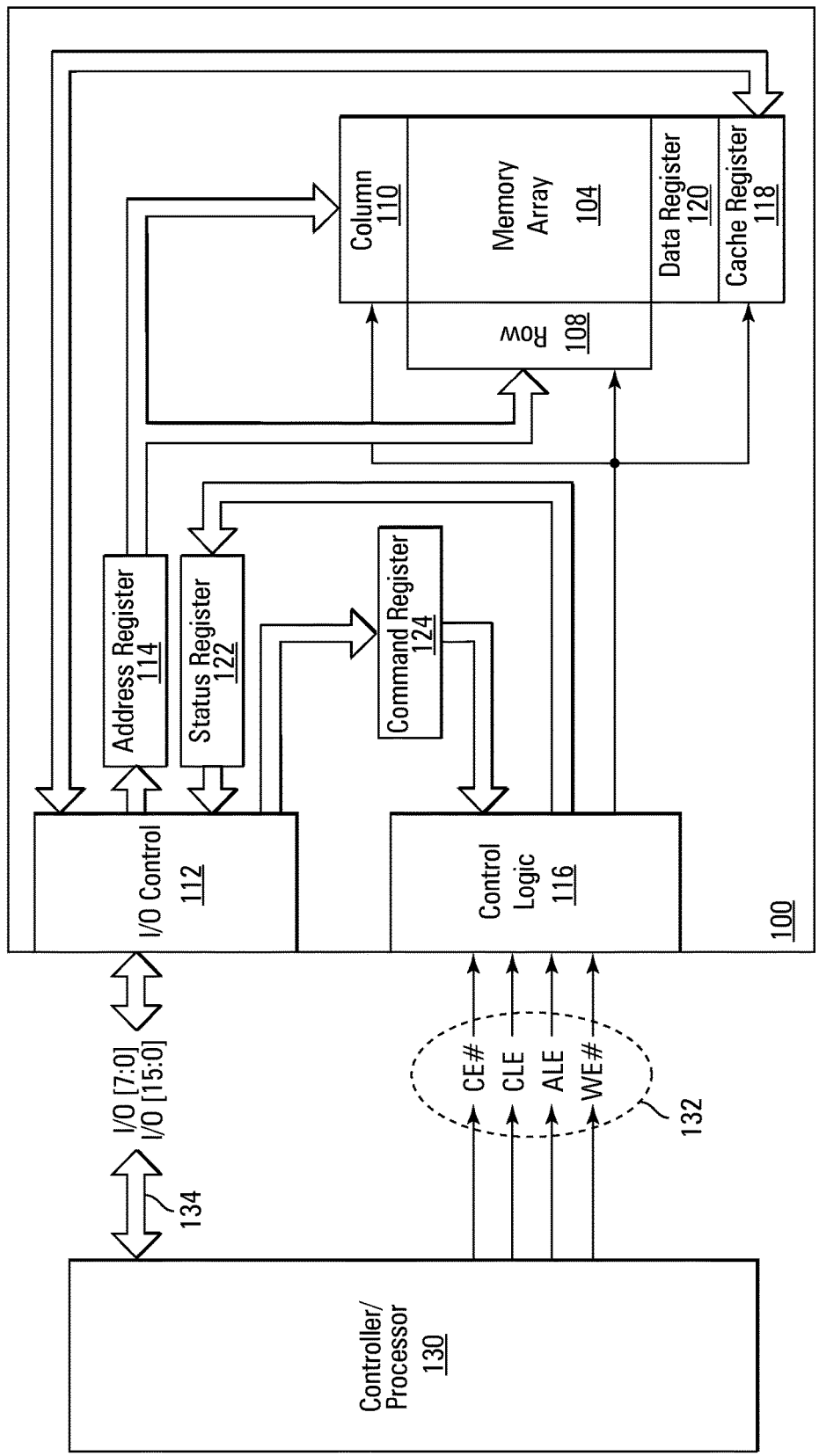
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

FIG. 1 is a simplified block diagram of an electronic device, e.g., an integrated circuit device, such a memory device 100, in communication with a controller 130, such as a memory controller, e.g. a host controller, as part of an electronic system, according to an embodiment. Memory device 100 might be a NAND flash memory device, for example.

Controller 130 might include a processor, for example. Controller 130 might be coupled to host, for example, and may receive command signals (or commands), address signals (or addresses), and data signals (or data) from the host and may output data to the host.

Memory device 100 includes an array of memory cells 104. Memory array 104 may be a stacked memory array, e.g., often referred to as three-dimensional memory array. Memory array 104 may be formed according to the embodiments disclosed herein. For example, memory 104 may include memory cells and/or select transistors having control gates formed according embodiments disclosed herein. For example, formation of a control gate might include forming a conductor comprising a concentration of germanium that varies with a thickness of the conductor and removing portions of the conductor at a variable rate that is governed, at least in part, by the concentration of the germanium.

For example, as used herein the concentration of germanium might be defined as the amount (e.g., the fraction) of germanium in a germanium-containing compound, such as a germanium-containing alloy, e.g., a polysilicon-germanium (poly-$Si_{1-x}Ge_x$) compound (e.g., alloy). The concentration of germanium might be the resultant mole fraction of germanium in the germanium-containing compound, such as a poly-$Si_{1-x}Ge_x$ alloy.

A row decoder 108 and a column decoder 110 might be provided to decode address signals. Address signals are received and decoded to access memory array 104.

Memory device 100 may also include input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116, to latch incoming commands. Control logic 116 controls access to the memory array 104 in response to the commands and generates status information for the external controller 130. The control logic 116 is in communication with row decoder 108 and column decoder 110 to control the row decoder 108 and column decoder 110 in response to the addresses.

Control logic 116 can be included in controller 130. Controller 130 can include, other circuitry, firmware, software, or the like, whether alone or in combination. Controller 130 can be an external controller (e.g., in a separate die from the memory array 104, whether wholly or in part) or an internal controller (e.g., included in a same die as the memory array 104).

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to controller 130 and subsequent output to a host; then new data is passed from the data register 120 to the cache register 118. A status register 122 is in communication with I/O control circuitry 112 and control logic 116 to latch the status information for output to the controller 130.

Memory device 100 receives control signals at control logic 116 from controller 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from controller 130 over a multiplexed input/output (I/O) bus 134 and outputs data to controller 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

FIGS. 2A-2F are cross-sectional views during various stages of fabrication of a portion of a stack of memory cells, such as vertical string of non-volatile memory cells coupled in series (e.g., a portion of a vertical NAND string). For example, the stack of memory cells may form a portion of a three-dimensional memory array, such as memory array 104 in FIG. 1.

Figure 2A:
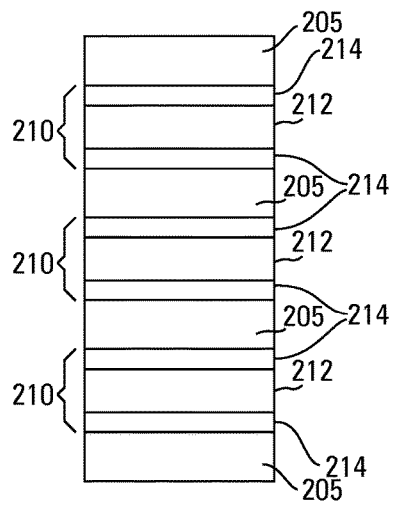
FIGS. 2A-2F are cross-sectional views during various stages of fabrication of a portion of a stack of memory cells, according to another embodiment.

FIG. 2A shows the formation of alternating dielectrics 205 and conductors 210. Dielectrics 205 may generally be formed of one or more dielectric materials, such as an oxide, e.g., silicon oxide, an oxynitride, e.g., silicon oxynitride, etc. Conductors 210 may include a conductive material 212, such as composition of polysilicon and germanium (e.g., poly-SiGe), between conductive materials 214, such as polysilicon. For example, conductive material 212 might have a higher (e.g., faster) removal rate (e.g., etch rate) than conductive materials 214, e.g., for a fixed etch chemistry. For some embodiments, conductive materials 214 might include a composition of polysilicon and germanium, where the concentration of germanium in conductive materials 214 is less than the concentration of germanium in conductive material 212 so that conductive material 212 might have a higher etch rate than conductive materials 214, e.g., for a fixed etch chemistry.

Figure 3:
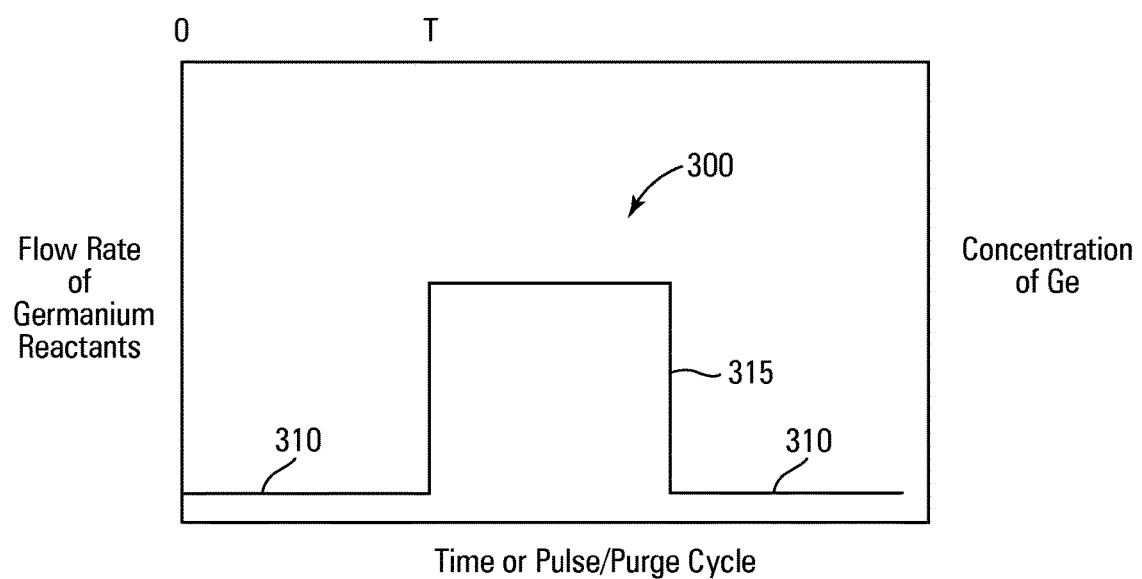
FIG. 3 shows the flow rate or concentration of the germanium reactants, during the formation of a conductor, according to another embodiment.

A conductor 210 might be formed, e.g., over a dielectric 205, using chemical vapor deposition (CVD). For example, a flow of reactants that form polysilicon (e.g., polysilicon reactants) may be fed into a reactor with a flow of reactants that form germanium (e.g., germanium reactants). For example, the germanium reactants might include a germanium-containing precursor, such as, but not limited to, germane $GeH_4$. FIG. 3 shows an example of a flow rate of germanium reactants that might be fed into the reactor as a function 300 of the processing time using CVD to form conductor 210 while a flow rate of polysilicon reactants might be held constant, or, when using atomic layer deposition (ALD) to form conductor 210, a concentration of germanium reactants that might be used as a function 300 of the number of pulse/purge cycles. While the following discussion may refer primarily to forming a conductor 210 using changes in flow rate of reactants in a CVD process, it will be understood that the discussion can be extended to changes in concentration of germanium reactants in CVD or ALD processes with similar structural results. For example, the concentration of germanium might be the resultant mole fraction of germanium in a germanium-containing compound, such as a poly-$Si_{1-x}Ge_x$ alloy.

The flow rate or concentration of germanium reactants during the formation of a conductor 210 may be represented by a rectangular function 300 of processing time or, for ALD, the number of pulse/purge cycles, as shown in FIG. 3. The flow rate of the germanium reactants represented by the portions 310 of function 300 occurs during the formation of portions (conductive materials) 214 of conductor 210. The flow rate of the germanium reactants represented by the portion (the rectangular pulse) 315 of function 300 occurs during the formation of portion (conductive material) 212 of conductor 210. Note that polysilicon reactants may be fed while germanium reactants are fed at a flow rate according to function 300.

The flow rate of germanium reactants represented by portions 310 of function 300 may be zero, e.g., in which case polysilicon reactants may be flowing absent the germanium reactants, so that the conductive materials 214 are polysilicon with no germanium. Alternatively, the flow rate of germanium reactants represented by portions 310 of function 300 may be small enough compared (e.g., relative) to the flow rate of germanium reactants represented by portion 315 of function 300 that forms conductive material 212 so that conductive material 212 might have a sufficiently higher etch rate than conductive materials 214. Therefore, the flow rate of germanium reactants represented by portions 310 of function 300 might be zero or non-zero, but sufficiently low so as to result in a substantially different etch rate between portions 212 and 214 of conductor 210. The exact flow rates and resultant concentrations are dependent upon the film deposition technique and etchant chemistry used but will be apparent to those of ordinary skill in the art.

The lower conductive material 214 of conductor 210 may be formed by feeding a flow of germanium reactants having a flow rate represented by left portion 310 of function 300, e.g., while the polysilicon reactants are flowing. While the polysilicon reactants continue to flow, the flow rate of the germanium reactants may be increased to a certain level, e.g., represented by portion 315 of function 300, to form conductive material 212. The upper conductive material 214 of conductor 210 may be formed using a flow rate for the germanium reactants represented by right portion 310 of function 300, e.g., while the polysilicon reactants are flowing.

The function 300 might also represent the profile of the germanium concentration in a conductor 210. For example, the germanium concentration in a conductor 210 may vary with distance (e.g., thickness) between the dielectrics 205 on either side of (e.g., above and below) the conductor 210, according to function 300. That is, the concentration of germanium in polysilicon may vary according to the function 300 with the thickness T of conductor 210, e.g. from a bottom surface of the conductor 210, for example. Therefore, a conductor 210 may be referred to as a compositionally graded conductor.

Note that conductor 210 may also include a variable concentration of polysilicon. For example, portions of conductor 210 having lower concentrations of germanium may have higher concentrations of polysilicon, and portions of conductor 210 having higher concentrations of germanium may have lower concentrations of polysilicon.

Figure 2B:
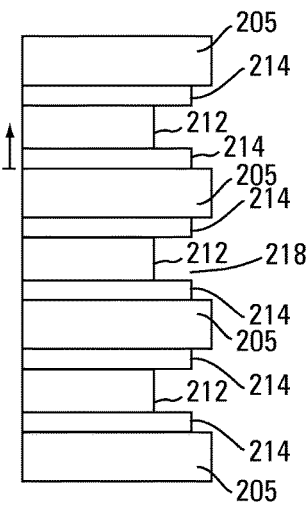

Portions of a conductor 210 may be subsequently removed, e.g., by etching, in FIG. 2B so that an end of conductor 210 might be indented (e.g., recessed) relative to the ends of the adjacent dielectrics 205 (e.g., vertically above and below the conductor 210). For example, portions of conductor 210 are removed so that an end of a central portion of conductor 210 is indented (e.g., recessed) relative to the ends of the outer portions of conductor 210 on either side of (e.g., vertically above and below) the central portion. That is, for example, a recess is formed in an end of conductor 210 that has a variable depth that is governed, at least in part, by the variable concentration of germanium. For example, portions of conductor are removed, e.g., by etching, at a rate governed, at least in part, by the variable concentration of germanium. For some embodiments, the maximum concentration of germanium, e.g., corresponding the portion of a conductor, such as conductor 210 (e.g., conductive material 212), having the highest (e.g., fastest) removal rate, might be in a range from about 20 percent germanium to about 50 percent germanium.

For example, conductive materials 212 and 214 are removed at different rates governed, at least in part, by their different concentrations of germanium so that an end of conductive material 212 is indented (e.g., recessed) relative to the ends of conductive materials 214. The higher concentration of germanium in the central portion of conductor 210 (e.g., conductive material 212) may cause it to be removed at a higher rate than the outer portions of conductor 210 (e.g., conductive materials 214), for example.

Non-limiting examples of etch chemistries suitable to etch poly-SiGe selective to poly-Si may include, for example: $HF:HNO_3:H_2O$-based solutions, $HF:H_2O_2:H_2O$-based solutions, and KOH or KOH-based solutions. Other examples may include etch chemistries suitable for reactive ion etches of poly-SiGe selective to poly-Si, such as $CF_4$-based plasma etches (e.g., $O_2$ can be added to tune selectivity by modifying the oxidation, $SF_6$ and $H_2$ can also be added to tune selectivity by modifying polymerization) and $HBr/Cl_2/O_2$ plasma etches (e.g., $HBr+Cl_2$ with a variable $O_2$ flow rate to control selectivity).

Figure 2C:
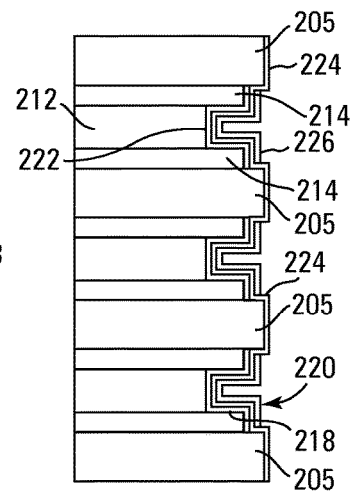

A dielectric 220, such as an inter-dielectric, may then be formed adjacent to (e.g., on) the recessed ends of conductors 210 in FIG. 2C. For example, dielectric 220 may be formed adjacent to (e.g., on) the recessed ends of conductive materials 212 and 214. Dielectric 220 may extend into a recess 218 (FIG. 2B) that is indented (e.g., recessed) relative to the ends of and that is between conductive materials 214. For example, dielectric 220 might line the recess 218. Note that conductive materials 214 may form prongs on either side of a recess 218, and thus on either side of dielectric 220, whose ends are recessed relative to dielectrics 205. Note that although the corners at the bottom and the top of recess 218 are shown as "sharp" (e.g., 90-degree) corners, the removal process may inherently round these corners.

For some embodiments, dielectric 220 may be generally formed of one or more dielectric materials, such as an oxide, e.g., silicon oxide, an oxynitride, e.g., silicon oxynitride, etc. For some embodiments, dielectric 220 may include oxide and nitride. For example, dielectric 220 might include an ONO material that may include an oxide 222 adjacent to (e.g., in direct physical contact with) the ends of conductive materials 212 and 214 that extends into (e.g., lines) the recess 218. The ONO material may include a nitride 224 adjacent to (e.g., on) oxide 222 and an oxide 226 adjacent to (e.g., on) nitride 224.

Figure 2D:
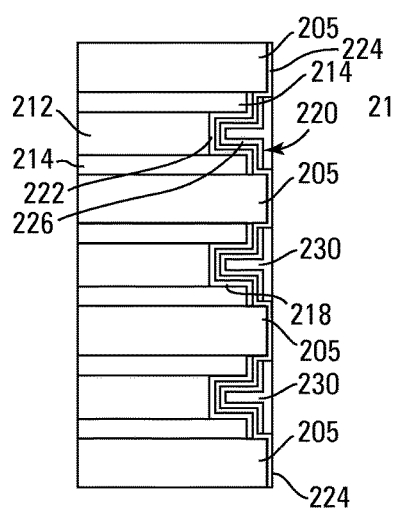

A charge-storage structure 230, such as a floating gate that may be a conductor (e.g., polysilicon), a charge trap that may be a dielectric, etc., might be formed adjacent to dielectric 220 in FIG. 2D. Non-limiting examples of dielectrics that are suitable for charge traps include nitrides, high-dielectric constant (high-K) dielectrics, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$.

Note that a portion of a charge-storage structure 230 extends into the recess 218 that is lined with dielectric 220 so that dielectric 220 is between the prongs of conductive material 214 and that portion of charge-storage structure 230. Another portion of dielectric 220 is between the ends of the prongs of conductive material 214 and another portion charge-storage structure 230.

Figure 2E:
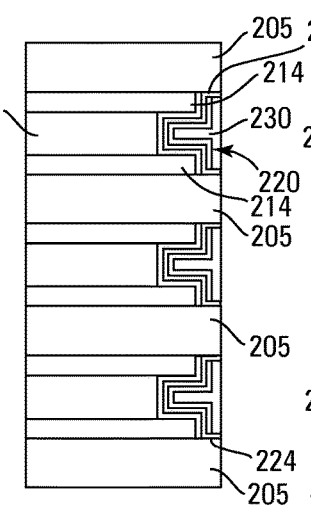

Portions of the oxide 224 may be removed from the ends of dielectrics 205, e.g., by an etch, in FIG. 2E, for some embodiments. A portion of the charge-storage structures 230 might also be removed, e.g., by an etch, so that outer ends of charge-storage structures 230 are flush (e.g., to within variations in the processing) with the ends of dielectrics 205 in FIG. 2E.

Figure 2F:
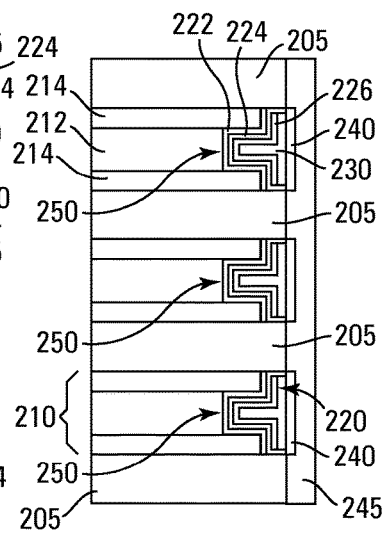

A dielectric 240, such as oxide, might be formed adjacent to an outer end of a charge storage structure 230 in FIG. 2F. A vertical semiconductor 245 (e.g., conductively doped polysilicon) might be formed adjacent to the ends of dielectrics 205 and adjacent to dielectrics 240 in FIG. 2F. For some embodiments, semiconductor 245 might be a vertical pillar.

A conductor 210 may form a control gate (e.g., that may form a portion of or that may be coupled to an access line) of a memory cell 250, e.g., a non-volatile memory cell, that includes a charge storage structure 230, a dielectric 220, e.g., as an inter-dielectric, and a dielectric 240, e.g., as a tunnel dielectric. Control gates formed from conductors 210 may be referred to as compositionally graded conductors, for example. Semiconductor 245 may couple the memory cells 250 in series to form a portion of a string of series-coupled memory cells 250. Semiconductor 245 may act as channel region for the string. For example, during operation of one or more memory cells 250 of the string, a channel can be formed in the semiconductor 245.

Forming a recess 218 in the end of a control gate increases the surface area of the control gate available for contact with dielectric 220. Lining a recess 218 with dielectric 220 and forming a charge-storage structure 230 in the lined recess 218 increases the surface area of the surface of dielectric 220 in contact with the control gate and/or the charge-storage structure without appreciably increasing the size of a memory cell 250. The increased surface area may act to improve the capacitive coupling between the charge-storage structure and the control gate, thereby improving the performance of memory cell 250.

Figure 4A:
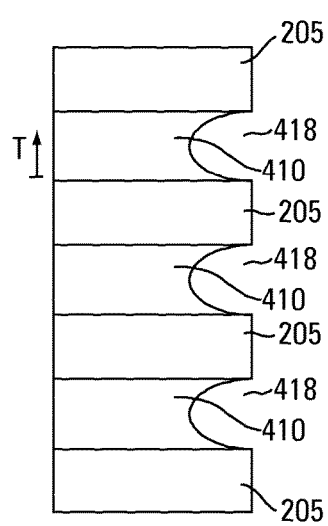
FIGS. 4A-4B are cross-sectional views during various stages of fabrication of a portion of a stack of memory cells, according to another embodiment.
Figure 4B:
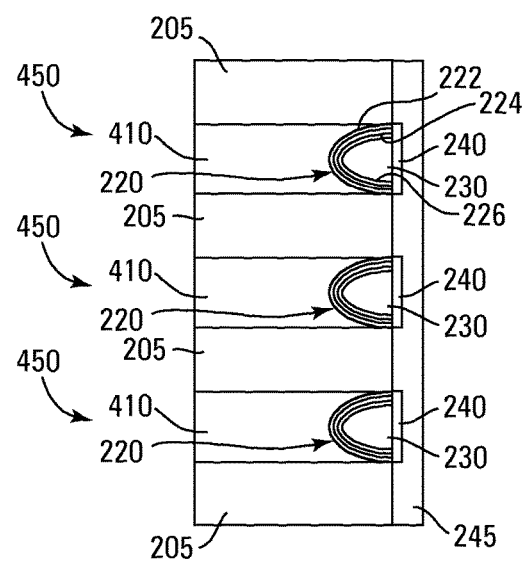

FIGS. 4A-4B are cross-sectional views during various stages of fabrication of a portion of a stack of memory cells, such as vertical string of non-volatile memory cells coupled in series (e.g., a portion of a vertical NAND string). For example, the stack of memory cells may form a portion of a three-dimensional memory array, such as memory array 104 in FIG. 1.

Figure 5:
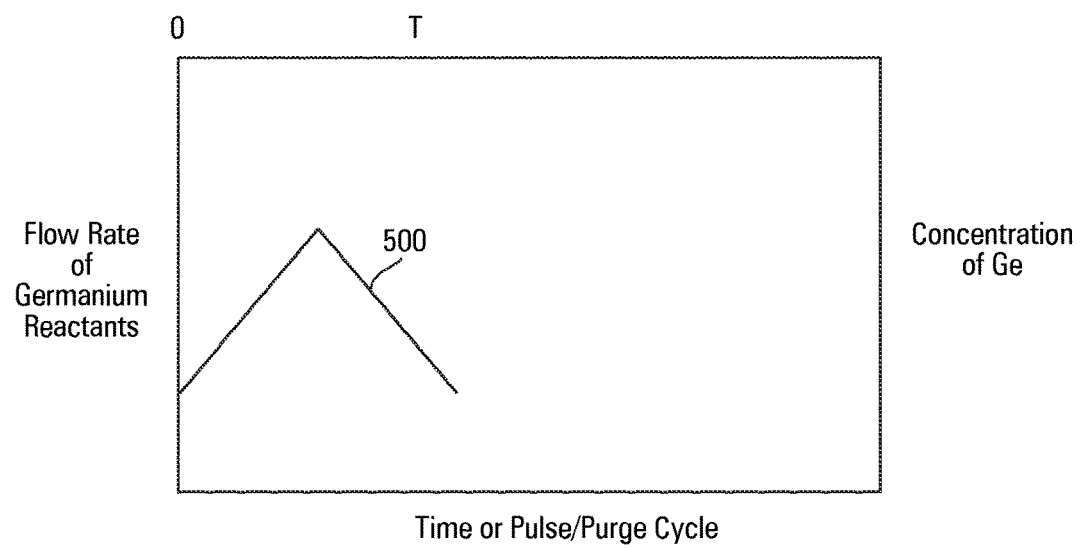
FIG. 5 shows the flow rate or concentration of the germanium reactants, during the formation of a conductor, according to another embodiment.

In FIG. 4A, a stack of alternating dielectrics 205 and conductors 410 may be formed. A conductor 410 might be formed, e.g., over a dielectric 205, using chemical vapor deposition (CVD). Conductor 410 may include polysilicon and a varying concentration of germanium. FIG. 5 shows an example of a flow rate of the flow germanium reactants that might be fed into a reactor as a function 500 of the processing time using CVD to form conductor 410 while a flow rate of polysilicon reactants might be held constant, or, when using ALD to form conductor 410, a concentration of germanium reactants that might be used as a function 500 of the number of pulse/purge cycles. For example, the germanium reactants might include a germanium-containing precursor, such as, but not limited to, germane $GeH_4$. While the following discussion may refer primarily to forming a conductor 410 using changes in flow rate of reactants in a CVD process, it will be understood that the discussion can be extended to changes in concentration of reactants in CVD or ALD processes with similar structural results.

FIG. 5 can also be thought of as showing the concentration profile of germanium in conductor 410. For example, the concentration of germanium might be the resultant mole fraction of germanium in a germanium-containing compound, such as a poly-$Si_{1-x}Ge_x$ alloy. The concentration of germanium, for example, might vary continuously with the thickness T of the conductor 410, e.g., with the distance from the dielectric 205 on one side (e.g., vertically below) conductor 405 to the dielectric 205 on the other side (e.g., vertically above) conductor 405.

The flow rate or concentration of the germanium reactants during the formation of a conductor 410 might vary as a triangular function 500 with the processing time or, for ALD, the number of pulse/purge cycles, e.g., while polysilicon reactants might flow at a constant flow rate (e.g., within the process variations of the set-point flow rate of the polysilicon reactants). For example, the flow rate of the flow germanium reactants fed into a reactor might increase linearly, e.g., from a zero flow rate, with time or the number of pulse/purge cycles up to a certain level (e.g., a maximum value of the flow rate) and then decrease linearly, e.g., from the maximum flow rate, with time or the number of pulse/purge cycles back to the zero flow rate while a flow of polysilicon reactants are fed into the reactor.

Triangular function 500 might be symmetric about a vertical axis passing through a processing time or a number of pulse/purge cycles at which the maximum flow rate occurs, for example. Note, for example, the concentration of germanium in a conductor 410 may vary as a triangular function 500 with the thickness T of conductor 410 from the dielectric 205 vertically below conductor 410. That is, the concentration of germanium in polysilicon may vary according to the function 500 with the thickness T of conductor 410, e.g. from a bottom surface of the conductor 210, for example. Therefore, a conductor 410 may be referred to as a compositionally graded conductor, and the control gate formed from conductor 410 might be referred to as a compositionally graded control gate.

Portions of a conductor 410 may be subsequently removed, e.g., by etching, at a rate governed, at least in part, by the variable concentration of germanium, to form a recess 418 with curved sidewalls. For example, the removal process might inherently curve the sidewalls of the recess so that the shape of the sidewalls of recess 418 might deviate from the triangular concentration profile.

The variation in the depth of recess 418 may be governed, at least in part, by the concentration of germanium in conductor 410, where the deepest part of recess 418 might correspond to the portion of conductor 410 having the highest concentration of germanium, and the shallower portions might correspond to portions of conductor 410 having lower concentrations of germanium. That is, the removal rate, e.g., etch rate, may increase with increasing concentration of germanium and vice versa, for example. Therefore, the removal rate may be governed, at least in part, by the concentration of germanium in conductor 410. Note that for some embodiments, conductors 410 may replace conductors 210 in FIGS. 2A-2F.

Note that although the triangular concentration profile in FIG. 5 is an example of a profile, e.g., with a peak concentration at its center, that is, at least in part, responsible for the deepest part of recess 418 being at or near the mid-thickness (e.g., the center) of conductor 410, other concentration profiles having a peak concentration at their center, such as a parabolic concentration profile, can be used to produce a conductor having a recess with its deepest part being at or near the mid-thickness thereof.

Recesses 418 may be subsequently lined with the dielectric 220 that may include an ONO material that may include oxide 222 adjacent to (e.g., on) the sidewalls of recess 418, a nitride 224 adjacent to (e.g., on) oxide 222, and an oxide 226 adjacent to (e.g., on) nitride 224, as shown in FIG. 4B. For example, dielectric 220 may be curved and may follow the curvature of the sidewalls of the recesses 418. Charge-storage structures 230 may be formed in the recesses 418 lined with dielectric 220, e.g., adjacent to (e.g., on) dielectric 220, as shown in FIG. 4B.

Dielectric 240 might be formed adjacent to an outer end of a charge storage structure 230, as shown in FIG. 4B. Vertical semiconductor 245 might be formed adjacent to the ends of dielectrics 205 and adjacent to dielectrics 240.

Conductor 410 may form a control gate (e.g., that may form a portion of or that may be coupled to an access line) of a memory cell 450, e.g., a non-volatile memory cell, that includes a charge storage structure 230, a dielectric 220, e.g., as an inter-dielectric, and a dielectric 240, e.g., as a tunnel dielectric. Semiconductor 245 may couple the memory cells 450 in series to form a portion of a string of series-coupled memory cells 450. Semiconductor 245 may act as channel region for the string. For example, during operation of one or more memory cells 450 of the string, a channel can be formed in the semiconductor 245.

Forming a recess 418 in the end of a control gate increases the surface area of the control gate available for contact with dielectric 220. Lining a recess 418 with dielectric 220 and forming a charge-storage structure 230 in the lined recess 418 increases the surface area of the surface of dielectric 220 in contact with the control gate and/or the charge-storage structure without appreciably increasing the size of a memory cell 450. The increased surface area may act to improve the capacitive coupling between the charge-storage structure and the control gate, thereby improving the performance of memory cell 450.

Figure 6A:
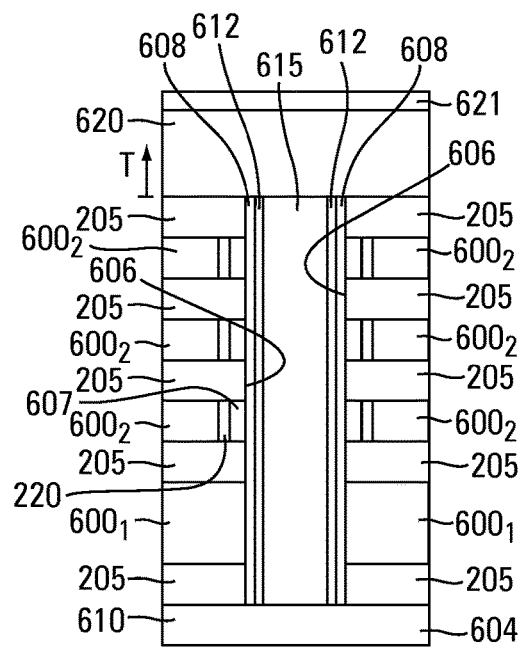
FIGS. 6A-6G are cross-sectional views of a portion of a memory array during various stages of fabrication, according to another embodiment.

FIGS. 6A-6G are cross-sectional views of a portion of a stacked memory array, e.g., three-dimensional memory array, such as a portion of memory array 104 of FIG. 1, during various stages of fabrication. FIG. 6A depicts the portion of the memory array after several processing steps have occurred. For example, the structure in FIG. 6A may include a stack of alternating control gates 600 and dielectrics 205. For example, the control gates 600 might include control gate $600_1$ and control gates $600_2$.

For example, control gate $600_1$ and control gates $600_2$ may be formed from conductors, such as polysilicon, polysilicon and germanium, etc. For some embodiments, the conductors may be formed in the same manner as conductors 210, as described above in conjunction with FIGS. 2A-2F, or in the same manner as conductors 410, as described above in conjunction with FIGS. 4A-4B. For example, the conductors might include a variable concentration of germanium with thickness, e.g., as shown in FIG. 3 or FIG. 5.

The conductors and dielectrics 205 may be formed over a semiconductor 604 to form a stack, e.g., a vertical stack, of alternating dielectrics 205 and conductors over semiconductor 604. An opening 606 may be formed through the stack of alternating dielectrics 205 and conductors stopping at an upper surface of or within semiconductor 604. This forms control gate $600_1$ and control gates $600_2$ that might surround opening 606.

For some embodiments, control gates $600_2$ might be recessed and a dielectric 220, such as an interlayer dielectric or a blocking dielectric, e.g., as described above in conjunction with FIG. 2C, might be formed in a recess adjacent to (e.g., in direct contact with) a respective control gate $600_2$. A charge-storage structure 607, such as a floating gate that may be a conductor (e.g., polysilicon), a charge trap that may be a dielectric, etc., may then be formed in a recess adjacent to (e.g., in direct contact with) a respective dielectric 220. For example, charge-storage structure 607 may be similar in composition (e.g., may have the same composition) as the charge-storage structure 230 discussed above in conjunction with FIG. 2D.

For some embodiments, dielectric 220 and the material of charge-storage structure 607 might be formed in opening 606 adjacent to the control gate $600_1$ and extending into the recesses corresponding to control gates $600_2$. A portion of dielectric 220 and a portion of the material of charge-storage structure 607 may then be removed from opening 606 and control gate $600_1$, e.g., using directional/vertical etch, so that remaining portions of dielectric 220 and the material of charge-storage structure 607 are left in the recesses corresponding to control gates $600_2$, as shown on FIG. 6A.

For some embodiments, control gates $600_2$ might be formed as described above for the control gates of memory cells 250 formed from conductors 210 in FIGS. 2A-2F or as described above for the control gates of memory cells 450 formed from conductors 410 in FIGS. 4A-4B. For embodiments where control gates $600_2$ might be formed as described above for the control gates of memory cells 250, portions of dielectric 220 may extend into and line recesses, such as the recesses 218 in FIG. 2B having prongs on either side thereof, in the ends of control gates $600_1$ and $600_2$ so that a portion of dielectric 220 is between the prongs of a control gate. A portion of charge-storage structure 607 might extend into the recess 218 that is lined with dielectric 220, e.g., as shown for charge-storage structure 230 in FIGS. 2D-2F.

For embodiments where control gates $600_2$ might be formed as described above for the control gates of memory cells 450, dielectrics 220 might line recesses, such as recesses 418, as shown in FIGS. 4A and 4B. A charge-storage structure 607 might extend into a recess 418 that is lined with dielectric 220, e.g., as shown for charge-storage structure 230 in FIGS. 4A and 4B.

Semiconductor 604 might be doped to have an n-type conductivity, e.g., an n+ conductivity level and may act as a source/drain 610, for example. Source/drain 610 might form a portion of or might be coupled to a source.

A dielectric 608, such as oxide, might be formed in opening 606 adjacent to (e.g., in direct contact with) charge storage structures 607, dielectrics 205, and control gate $600_1$. A sacrificial liner 612 that may include one or more dielectrics, such as a nitride and/or an oxide, a conductor, such as polysilicon, etc., might be formed in opening 606 adjacent to (e.g., in direct contact with) dielectric 608.

A sacrificial material 615 that may include one or more dielectrics, such as a nitride and/or an oxide, a conductor, such as polysilicon, etc., might be formed in opening 606 adjacent to (e.g., in direct contact with) sacrificial liner 612 and may completely fill opening 606 lined with dielectric 608 and sacrificial liner 612. Portions of dielectric 608, sacrificial liner 612, and/or sacrificial material 615 may extend over the top surface of the uppermost dielectric 205 and may be removed, e.g., by CMP, so that the upper ends of dielectric 608, sacrificial liner 612, and sacrificial material 615 are flush (e.g., to within the variations in the processing) with the top surface of the uppermost dielectric 205.

A conductor 620, e.g. of polysilicon and germanium, may be formed over (e.g., in direct contact with) the upper ends of dielectric 608, sacrificial liner 612, and sacrificial material 615 and the top surface of the uppermost dielectric 205. Conductor 620 may have a variable concentration of germanium. For example, the concentration of germanium may decrease linearly with increasing vertical distance (e.g., increasing thickness T of conductor 620) above the top surface of the uppermost dielectric 205.

Figure 7:
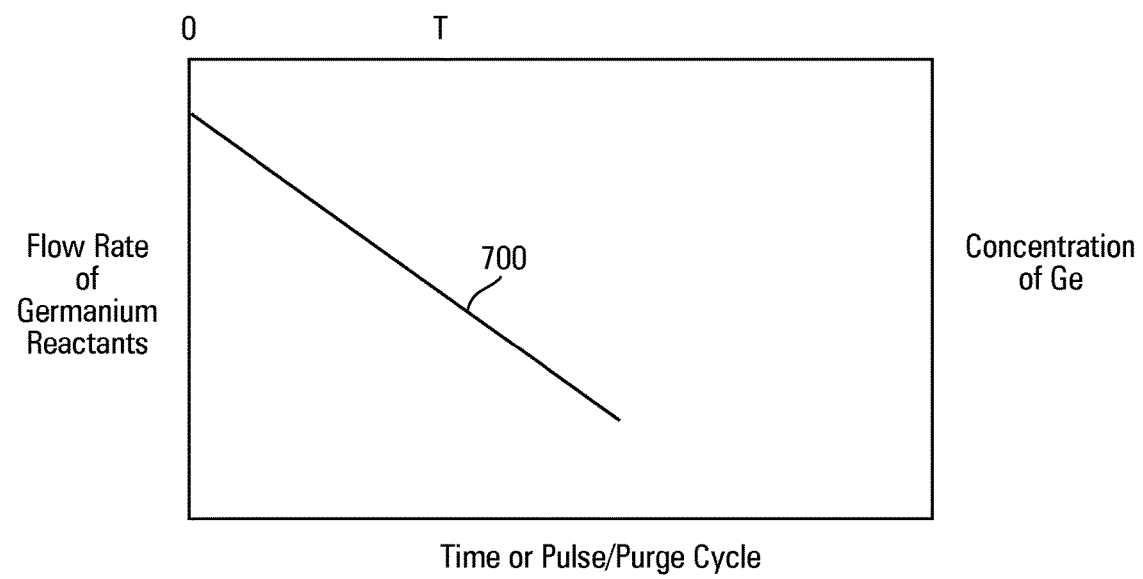
FIG. 7 shows the flow rate or concentration of the germanium reactants, during the formation of a conductor, according to another embodiment.

Conductor 620 might be formed using chemical vapor deposition (CVD). FIG. 7 shows an example of a flow rate of the flow germanium reactants that might be fed into a reactor as a function 700 of the processing time using CVD to form conductor 620 while a flow rate of polysilicon reactants might be held constant, or, when using ALD to form conductor 620, a concentration of germanium reactants that might be used as a function 700 of the number of pulse/purge cycles. For example, the germanium reactants might include a germanium-containing precursor, such as, but not limited to, germane $GeH_4$. While the following discussion may refer primarily to forming a conductor 620 using changes in flow rate of reactants in a CVD process, it will be understood that the discussion can be extended to changes in concentration of reactants in CVD or ALD processes with similar structural results.

The flow rate of the flow germanium reactants fed into a reactor might vary as a linear function 700 with the processing time or the number of pulse/purge cycles, e.g., while the flow of polysilicon reactants fed into the reactor might flow at a constant flow rate (e.g., within the process variations of the set-point flow rate of the polysilicon reactants). For example, the flow rate of the flow of germanium reactants fed into a reactor might decrease linearly, e.g., from a maximum flow rate, with time or the number of pulse/purge cycles down to a certain level while a flow of polysilicon reactants is fed into the reactor.

Note, for example, that the concentration of germanium may vary as the linear function 700 with the distance (e.g., thickness) from the uppermost dielectric 205. That is, the concentration of germanium in polysilicon may vary according to the function 700 with the thickness T of conductor 620, e.g. from a bottom surface of the conductor 620, for example. Therefore, a conductor 620 may be referred to as a compositionally graded conductor, and the control gate formed from conductor 620 might be referred to as a compositionally graded control gate. The concentration of germanium might be the resultant mole fraction of germanium in a germanium-containing compound, such as a poly-$Si_{1-x}Ge_x$ alloy, for example. A hard mask 621, e.g., of silicon nitride, may then be formed over (e.g., in direct contact with the upper surface of) conductor 620, as shown in FIG. 6A.

Figure 6B:
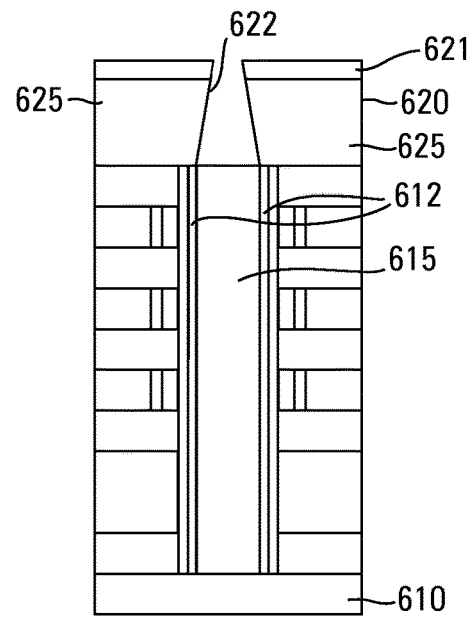

Hard mask 621 may then be patterned to form an opening 622 through hard mask 621 and conductor 620, stopping at the upper ends of sacrificial liner 612 and sacrificial material 615, as shown in FIG. 6B. For example, a mask (not shown), e.g., imaging resist, such as photo-resist, may be formed over hard mask 621 and patterned to expose regions of hard mask 621. The exposed regions of hard mask 621 and portions of conductor 620 under the exposed regions of hard mask 621 may be subsequently removed, e.g., by dry or wet etching, to form opening 622 that may terminate at the upper ends of sacrificial liner 612 and sacrificial material 615. Formation of opening 622 forms a control gate 625 around opening 622.

Note that opening 622 tapers (e.g., converges) with increasing distance upward from the upper end of sacrificial material 615, e.g., with the increasing thickness T of conductor 620. This is due to a decreasing removal (e.g., etch) rate with the increasing thickness T of conductor 620, governed by the decreasing (e.g., linearly decreasing) concentration of germanium with the increasing thickness T of conductor 620. For example, the removal rate of the conductor 620 during the formation of opening 622, and thus the size of opening 622 with the thickness T of conductor 620, may be governed by the concentration of the germanium in conductor 620. That is, for example, the amount of taper (e.g. convergence) of opening 622 with the thickness T may be governed by the variation of the concentration of the germanium in conductor 620 with the thickness T.

As such, an end of control gate 625 adjacent to opening 622 may be angled, as shown in FIG. 6B. For example, control gate 625 may be referred to as compositionally graded control gate. Although, the tapered portion of control gate 625 is shown as being straight in FIG. 6B, the removal process might inherently curve the tapered portion of control gate 625, for example.

Figure 6C:
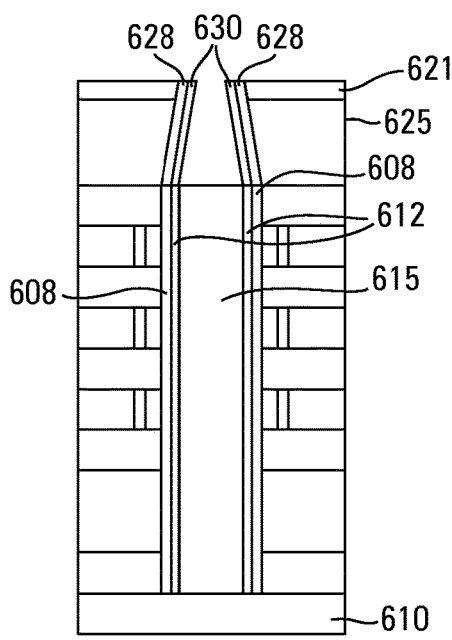

In FIG. 6C, a dielectric 628 may be formed adjacent to (e.g., in direct contact with) the sidewalls of opening 622 and thus the end of control gate 625. That is, dielectric 628 may line opening 622, for example. Dielectric 628 may generally be formed of one or more dielectric materials, such as an oxide, e.g., silicon oxide, an oxynitride, e.g., silicon oxynitride, etc. Dielectric 628 might be a gate dielectric 628, for example.

A sacrificial liner 630 that may include one or more dielectrics, such as a nitride and/or an oxide, a conductor, such as polysilicon, etc., might be formed in opening 622 adjacent to (e.g., on) dielectric 628, as shown in FIG. 6C.

Figure 6D:
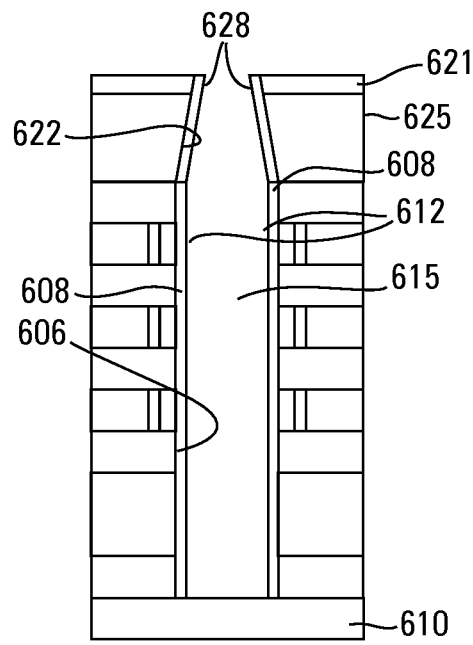

Sacrificial liner 612 and sacrificial material 615 may be removed from opening 606 in FIG. 6D, leaving dielectric 608 in opening 606. Sacrificial liner 630 may also be removed from opening 622 in FIG. 6D, leaving dielectric 628 in opening 622.

Figure 6E:
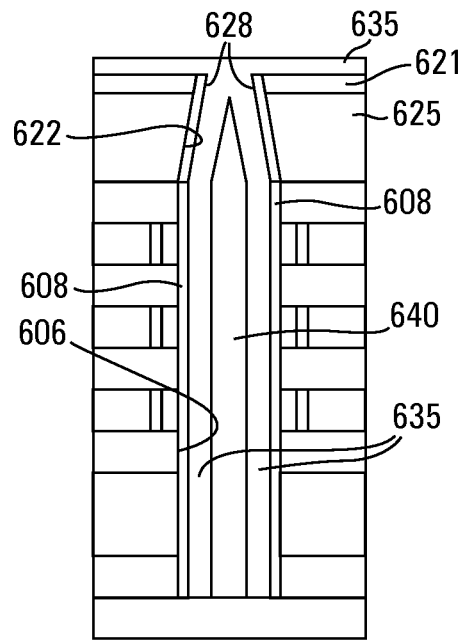

A semiconductor 635 (e.g., conductively doped polysilicon) might be formed in opening 606 adjacent to (e.g. in direct contact with) dielectric 608 and in opening 622 adjacent to (e.g. in direct contact with) dielectric 628 in FIG. 6E so that semiconductor 635 pinches off adjacent to a top of opening 622, e.g., adjacent to a top surface of conductor 620 (e.g., the top surface of control gate 625) before the openings 606 and 622, and thus the opening 640 formed by contiguous openings 606 and 622, can be completely filled with semiconductor 635, e.g., so that semiconductor 635 lines opening 640. Note that semiconductor 635 might extend over the upper surface of hard mask 621, as shown in FIG. 6E. Semiconductor 635 thus closes opening 640 adjacent to the top thereof. Note that the pinch off of semiconductor 635 and thus the closure of opening 640 may be facilitated by the tapering of the upper portion of opening 640, corresponding to opening 622.

Figure 6F:
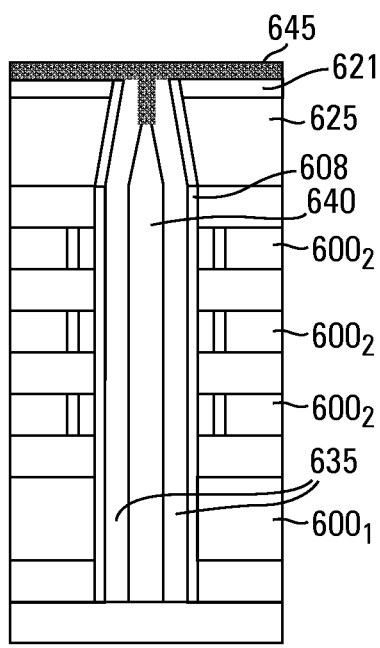

In FIG. 6F, a conductive region 645, e.g., having an n-type conductivity, e.g., an n+ conductivity level, is then formed in the portion of semiconductor 635 that extends over the upper surface of hard mask 621 and in the pinched portion of semiconductor 635 that closes opening 640. A source/drain 650 may then be formed and in the pinched portion of semiconductor 635 in FIG. 6G from conductive region 645 by removing conductive region 645 from the upper surface of hard mask 621 and removing hard mask 621 from control gate 625, e.g., by CMP, and leaving a portion of conductive region 645 that forms source/drain 650 in the pinched portion of semiconductor 635 that closes opening 640. Source/drain 650 may be coupled to a data line, such as a bit line, for some embodiments.

For some embodiments, closed opening 640 may be a gas-containing gap and may contain air, oxygen, nitrogen, argon, neon or other gas compatible (e.g., inert) with the surrounding structures, or a gas containing a mixture of one or more such gaseous components. For one or more embodiments, the gas contained in the gas-containing gap may further be below atmospheric pressure, e.g., closed opening 640 may contain a vacuum. For other embodiments closed opening 640 might contain (e.g., might be completely filled with) a solid dielectric.

Figure 6G:
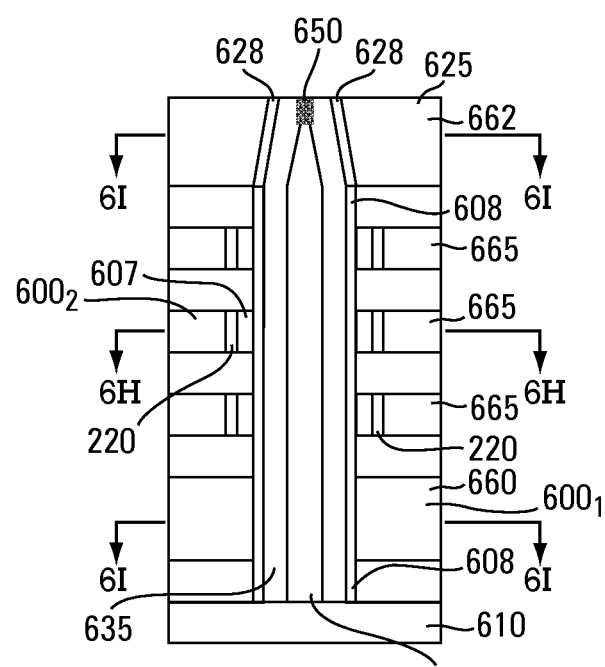

Control gate $600_1$ (FIG. 6F) may be a control gate of a select transistor 660, such as a source select transistor, in FIG. 6G. Select transistor 660 might include a portion of dielectric 608 that might act as a gate dielectric for select transistor 660. Control gate 625 (FIG. 6F) may be the control gate of a select transistor 662, such as a drain select transistor, in FIG. 6G. Select transistors 662 may include gate dielectric 628.

The control gates $600_2$ (FIG. 6F) may be control gates of memory cells 665, e.g., non-volatile memory cells. A memory cell 665 may include a portion of dielectric 608 that might act as a tunnel dielectric of that memory cell 665, a charge storage structure 607, a dielectric 220, and a control gate $600_2$.

Semiconductor 635 couples memory cells 665 in series to form a string of series-coupled memory cells 665. Semiconductor 635 couples the string of series-coupled memory cells 665 in series with select transistors 660 and 662. Semiconductor 635 may act as channel region for the string of series-coupled memory cells 665. For example, during operation of one or more memory cells 665 of a string, a channel can be formed in the semiconductor 635.

Figure 6H:
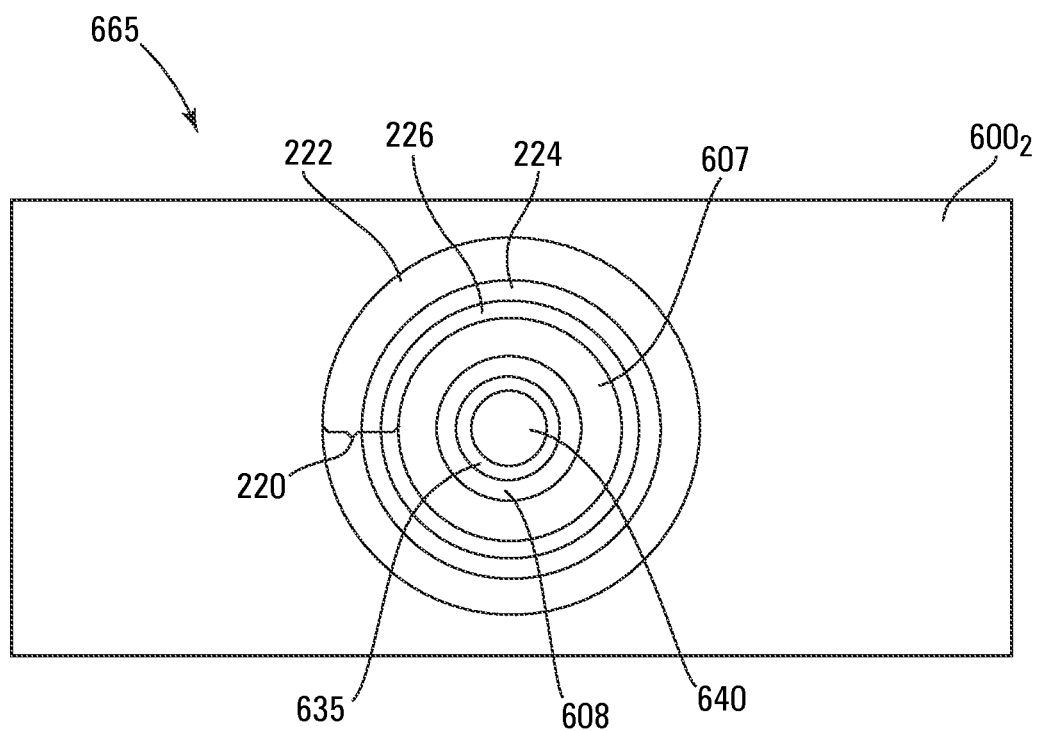
FIG. 6H is a cross-section of a memory cell as viewed along a line 6H-6H in FIG. 6G.
Figure 6I:
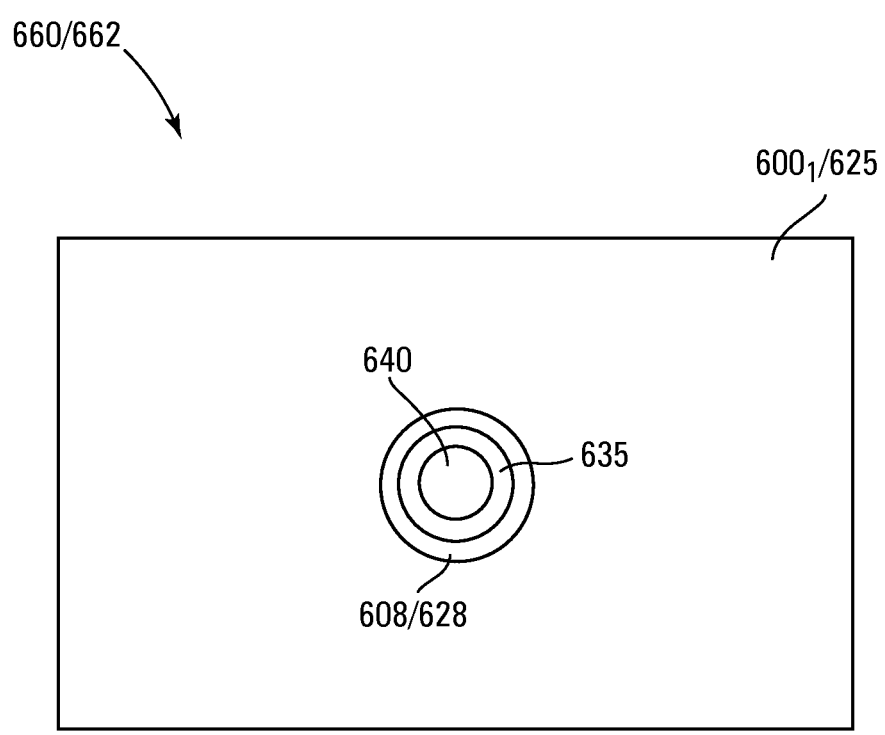
FIG. 6I is a cross-section of a select transistor as viewed along lines 6I-6I in FIG. 6G.

FIG. 6H is a cross-section of a memory cell 665 as viewed along a line 6H-6H in FIG. 6G. Note that dielectric 220 might include an ONO material that may include an oxide 226 adjacent to (e.g., in direct physical contact with) charge-storage structure 607, a nitride 224 adjacent to (e.g., in direct physical contact with) oxide 226, and an oxide 222 adjacent to (e.g., in direct physical contact with) nitride 224. FIG. 6I is a cross-section of select transistors 660 and 662 as viewed along lines 6I-6I in FIG. 6G.

For some embodiments, the string of series-coupled memory cells 665 may be replaced by the string of series-coupled memory cells 250 shown in FIG. 2F or the string of series-coupled memory cells 450 shown in FIG. 4B. For example, a memory cell 665 might include a discrete tunnel dielectric, such as a discrete tunnel dielectric 240 as discussed above in conjunction with FIGS. 2F and 4B and as shown in FIGS. 2F and 4B.

The pinch off of semiconductor 635 facilitated by the tapering of the upper portion opening 640 acts to eliminate one or more process steps. For example, in some conventional processes, the formation of source/drain 650 might require opening 640 to be refilled with a dielectric, and the dielectric to be subsequently recessed to facilitate the formation of source/drain 650. Such a refilling can be difficult in high aspect ratio (e.g., high depth-to-width ratio) openings. Some dielectrics used for the refill may be of low quality and may negatively impact device performance. Therefore, it might be desirable to remove the dielectric, using an additional process step, to form a gas-containing gap.

Figure 8:
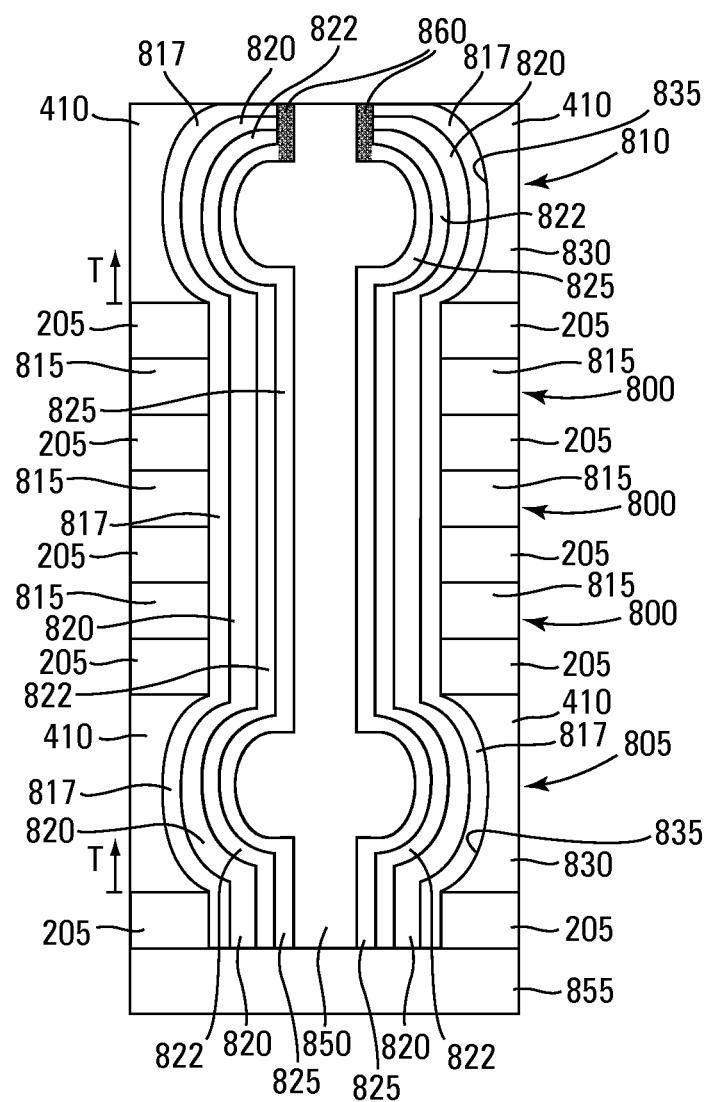
FIG. 8 is a cross-sectional view of a portion of a stacked memory array, according to another embodiment.

FIG. 8 is a cross-sectional view of a portion of a stacked memory array, e.g., a three-dimensional memory array, such as a portion of memory array 104 of FIG. 1. A string (e.g., a vertical string) of series-coupled memory cells 800 are between and coupled in series with select transistors 805 and 810. For example, select transistor 805 might be a source select transistor, and select transistor 810 might be a drain select transistor.

Each memory cell 800 may include a control gate 815 adjacent to (e.g., that may surround) a portion of a dielectric 817, such as a blocking dielectric. The control gates 815 may alternate with dielectrics 205 that may be adjacent to (e.g., that may surround) dielectric 817.

Dielectric 817 may be generally formed of one or more dielectric materials, such as an oxide, e.g., silicon oxide, an oxynitride, e.g., silicon oxynitride, etc. For some embodiments, dielectric 817 may include oxide and nitride. For example, dielectric 817 might include an ONO material.

Each memory cell 800 may include a portion of a charge-storage structure 820. For example, dielectric 817 may be adjacent to (e.g., may surround) charge-storage structure 820. Charge-storage structure 820 may be a charge trap that may be a dielectric, such as a nitride, a high-dielectric constant (high-K) dielectric, such as alumina ($Al_2O_3$) having a K of about 10, with embedded conductive particles (e.g., nano-dots), such as embedded metal particles or embedded nano-crystals (e.g., silicon, germanium, or metal crystals), a silicon rich dielectric, or $SiON/Si_3N_4$.

Each memory cell 800 may include a portion of a dielectric 822, such as an oxide, that may act as a tunnel dielectric of the respective memory cell 800. For example, charge-storage structure 820; may be adjacent to (e.g., may surround) dielectric 822.

A semiconductor 825 (e.g., of conductively doped polysilicon) may be adjacent to dielectric 822. For example, dielectric 822 might surround semiconductor 825. Semiconductor 825 may act as channel region for the string of memory cells 800. For example, during operation of one or more memory cells 800 of the string, a channel can be formed in semiconductor 825.

Select transistor 805 and select transistor 810 may include a control gate 830. Each control gate 830 may have a recess 835 formed in an end thereof. Each recess 835 may have a curved sidewall. For some embodiments, a curved portion of dielectric 817 might be formed adjacent to (e.g., in direct contact with) a curved sidewall of a recess 835. For example, a control gate 830 might surround a respective curved portion of dielectric 817. For example, the curved portion of dielectric 817 might follow the curvature of the curved sidewall of a recess 835. That is, the dielectric 817 might line a recess 835, for example.

A curved portion of charge-storage structure 820 may be formed adjacent to (e.g., in direct contact with) the curved portion of dielectric 817. For example, the curved portion of charge-storage structure 820 might be formed in a recess 835 lined with the curved portion of dielectric 817. For example, the curved portion of charge-storage structure 820 might follow the curvature of the curved portion of dielectric 817.

A curved portion of dielectric 822 may be formed adjacent to (e.g., in direct contact with) the curved portion of charge-storage structure 820. For example, the curved portion of dielectric 822 might be formed in a recess 835 lined with the curved portion of dielectric 817 and the curved portion of charge-storage structure 820. For example, the curved portion of dielectric 822 might follow the curvature of the curved portion of charge-storage structure 820, and thus the curvature of the curved sidewall of a recess 835.

A curved portion of semiconductor 825 may be formed within a recess 835 lined with curved portions of dielectric 817, charge-storage structure 820, and dielectric 822. For example, the curved portion of semiconductor 825 may be formed adjacent to (e.g., in direct contact with) the curved portion of dielectric 822. The curved portion of semiconductor 825 may follow the curvature of the curved portion of dielectric 822, and thus the curvature of the curved sidewall of a recess 835. For some embodiments, the curved portion of dielectric 822 might function as a tunnel dielectric.

Each control gate 830 might be formed from a conductor, e.g., of polysilicon and a varying concentration of germanium, such as a conductor 410 (e.g., a compositionally graded conductor) whose formation is described above in conjunction with FIGS. 4A and 5. Note that the flow rate of germanium might vary with time or the number of pulse/purge cycles as shown in FIG. 5 during the formation of conductor 410 so that the concentration of germanium varies with vertical distance (e.g., the thickness T of conductor 410), as shown in FIG. 5.

The variation in the depth of a recess 835 is governed, at least in part, by the concentration of germanium in conductor 410, where the deepest part of recess 835 corresponds to the portion of conductor 410 having the highest concentration of germanium, and the shallower portions correspond to portions of conductor 410 having lower concentrations of germanium. That is, the removal rate of conductor 410 during the formation of a recess 835 is governed, at least in part, by the concentration of germanium in conductor 410. Note the removal process inherently curves the shape of sidewalls so that the sidewalls of recess 835 may deviate from the shape of the concentration profile in FIG. 5.

A dielectric 850, such as a dielectric pillar, that might be generally formed of one or more dielectric materials, such as an oxide, e.g., silicon oxide, an oxynitride, e.g., silicon oxynitride, etc., might be formed adjacent to (e.g., in direct contact with) semiconductor 825. A source/drain 855, e.g., having an n-type conductivity (e.g., an n+ conductivity level) might be formed adjacent to lower ends of semiconductor 825. Source/drain 855 might form a portion of or be coupled to a source, for example. A source/drain 860, e.g., having an n-type conductivity (e.g., an n+ conductivity level) might be formed in the upper end of semiconductor 825, as shown in FIG. 8. Source/drain 860 might be coupled to a data line, such as a bit line (not shown), for example.

Select transistor 805 might be configured to selectively couple the string of series-coupled memory cells to the source, and select transistor 810 might be configured to selectively couple the string of series-coupled memory cells to the data line. For example, select transistors 805 and 810 might be programmable select transistors and might respectively be programmed to respectively couple the string of memory cells to the source and data line in response to receiving a certain voltage. For example, select transistors 805 and 810 might be configured as memory cells. Note that select transistors 805 and 810 include a portion of semiconductor 825 that may act as a channel, a portion of dielectric 822 that may act as a tunnel dielectric, a portion of charge-storage structure 820, a portion of dielectric 817 that may act as a blocking dielectric, and a control gate 830.

For some embodiments, the recess 835 in the control gate 830 of select transistor 805 might be omitted. Therefore, the portions of dielectric 817, charge-storage structure 820, dielectric 822, and semiconductor 825 corresponding to select transistor 805 would be straight instead on being curved.

Forming a recess 835 in the end of a control gate 830 increases the surface area of the control gate 830 available for contact with dielectric 817 and thus may increase the dielectric coupling between control gate 830 and charge-storage structure 820, without appreciably increasing the size of select transistor 805 and/or select transistor 810. This can act to improve device performance by reducing boost loss and disturb.

Figure 9:
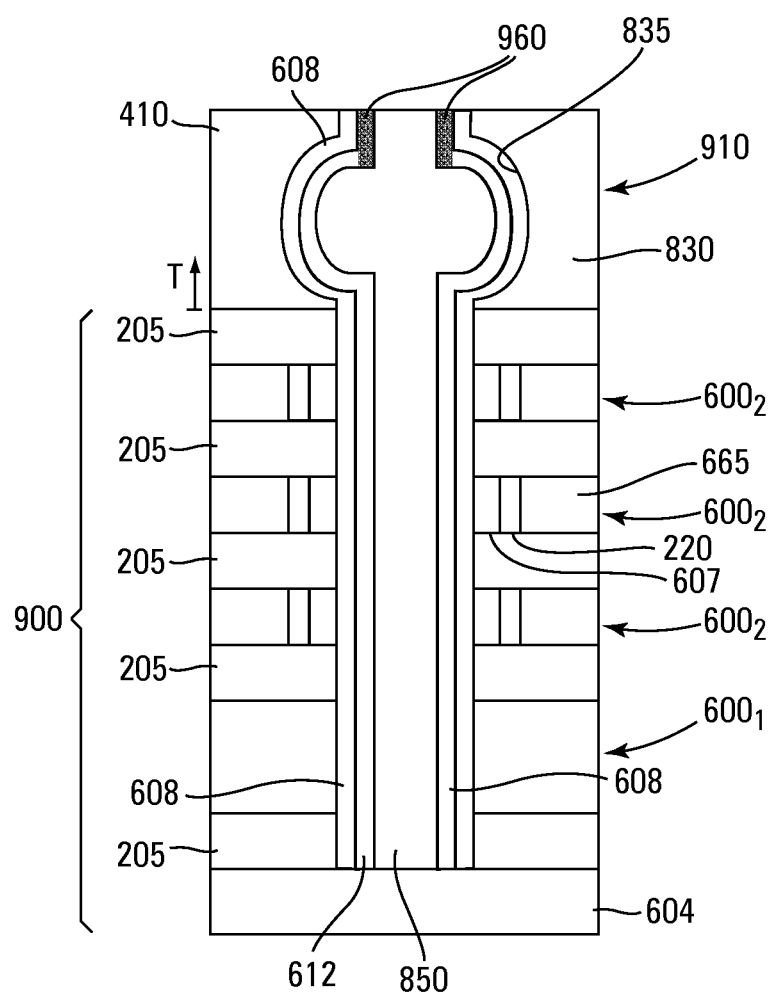
FIG. 9 is a cross-sectional view of a portion of a stacked memory array, according to another embodiment.

FIG. 9 is a cross-sectional view of a portion of a stacked memory array, e.g., a three-dimensional memory array, such as a portion of memory array 104 of FIG. 1. Portion 900 of the structure in FIG. 9 might be formed as described above in conjunction with FIG. 6A. As such, common numbering is used in FIGS. 6A and 9 for similar (e.g., the same) components in FIGS. 6A and 9.

Control gate 830 of select transistor 910 may be formed as described above in conjunction with FIG. 8, and may include the curved recess 835. Note that common numbering is used in FIGS. 8 and 9 for similar (e.g., the same) components in FIGS. 8 and 9.

A curved portion of dielectric 608 might be formed adjacent to (e.g., in direct contact with) the curved sidewall of recess 835. For example, a control gate 830 might surround dielectric 822. For example, curved portion of dielectric 608 might follow the curvature of the curved sidewall of the recess 835. That is, the curved portion of dielectric 608 might line the recess 835, for example.

A curved portion of semiconductor 612 might be formed within recess 835 lined with dielectric 608. For example, the curved portion of semiconductor 612 may be formed adjacent to (e.g., in direct contact with) the curved portion of dielectric 608. The curved portion of semiconductor 612 may follow the curvature of the curved portion of dielectric 608, and thus the curvature of the curved sidewall of recess 835. For some embodiments, the curved portion of dielectric 608 might function as a gate dielectric of select transistor 910.

A source/drain 960, e.g., having an n-type conductivity (e.g., an n+ conductivity level) might be formed in the upper end of semiconductor 612, as shown in FIG. 9. Source/drain 960 might be coupled to a data line, such as a bit line (not shown), for example.

Lining a recess 835 with a gate dielectric and forming a portion of a semiconductor 612 in the lined recess 835 increases the surface area of the surface of the portion of the gate dielectric in contact with the control gate and/or the portion of a semiconductor 612 without appreciably increasing the size of select transistor 910. The increased surface area may act to improve device performance by reducing boost loss and disturb.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of forming a control gate, comprising:
   forming a conductor over a first dielectric by varying a flow rate of reactants that form germanium according to a predetermined function of time or of a number of pulse/purge cycles to form the conductor comprising a concentration of germanium that varies as a predetermined function of a thickness of the conductor;
   forming a second dielectric over the conductor so that the conductor is between the first dielectric and the second dielectric;
   forming an opening that extends through the second dielectric, the conductor, and the first dielectric; and
   recessing an end of the conductor adjacent to the opening relative to ends of the first and second dielectrics adjacent to the opening by removing portions of the conductor at a variable rate that is governed, at least in part, by the concentration of the germanium so that a distance from the end of the conductor to the ends of the first and second dielectrics varies with the thickness of the conductor,
   wherein a largest distance from the end of the conductor to the ends of the first and second dielectrics occurs at a thickness of the conductor that is at a center of the conductor midway between the first and second dielectrics.

2. The method of claim 1, wherein removing the portions of the conductor at the variable rate that is governed, at least in part, by the concentration of the germanium, comprises etching the conductor at a variable rate that is governed, at least in part, by the concentration of the germanium.

3. The method of claim 1, wherein removing the portions of the conductor at the variable rate that is governed, at least in part, by the concentration of the germanium, comprises removing portions of the conductor having a higher concentration of germanium at a higher rate than portions of the conductor having a lower concentration of germanium.

4. The method of claim 1, wherein the predetermined function of the thickness of the conductor is a triangular function of the thickness of the conductor.

5. The method of claim 1, wherein the control gate is a control gate of a memory cell or a control gate of a select transistor.

6. The method of claim 1, wherein the reactants that form the germanium are being fed into a reactor using the varying flow rate, and further comprising feeding reactants that form polysilicon into the reactor at a constant flow rate while varying the flow rate of the reactants that form the germanium according to the predetermined function of time or of the number of pulse/purge cycles.

7. A method of forming a select transistor, comprising:
   varying a flow rate of reactants that form germanium according to a predetermined function of time or of a number of pulse/purge cycles to form a control gate comprising a concentration of germanium that varies as a predetermined function of a thickness of the control gate;
   forming a recess in the control gate, the recess comprising a surface of the control gate at a variable depth that is governed, at least in part, by the concentration of the germanium and that varies with the thickness of the control gate;
   forming a dielectric in the recess in the control gate and on the surface of the control gate at the variable depth so that a surface of the dielectric is on the surface of the control gate at the variable depth and so that the dielectric lines the recess; and
   forming a semiconductor in the recess in the control gate that is lined with the dielectric adjacent to the dielectric;
   wherein a deepest part of the recess occurs at a thickness of the control gate that is at a center of the control gate.

8. The method of claim 7, wherein the surface of the control gate at the variable depth is a curved surface.

9. The method of claim 8, wherein forming a dielectric in the recess in the control gate and on the surface of the control gate comprises forming the dielectric to follow a curvature of the curved surface of the control gate.

10. The method of claim 7, wherein the dielectric is a first dielectric, and further comprising:
    forming a charge-storage structure in the recess between the first dielectric and the semiconductor; and
    forming a second dielectric between the charge-storage structure and the semiconductor.

11. The method of claim 7, wherein the select transistor is coupled in series with a vertical string of series-coupled memory cells.

12. A method of forming a select transistor, comprising:
varying a flow rate of reactants that form germanium according to a predetermined function of time or of a number of pulse/purge cycles to form a control gate comprising a concentration of germanium that varies as a predetermined function of a thickness of the control gate;
forming a recess in the control gate, the recess comprising a surface of the control gate at a variable depth that is governed, at least in part, by the concentration of the germanium and that varies with the thickness of the control gate;
forming a dielectric in the recess in the control gate and on the surface of the control gate at the variable depth so that a surface of the dielectric is on the surface of the control gate at the variable depth and so that the dielectric lines the recess; and
forming a semiconductor in the recess in the control gate that is lined with the dielectric adjacent to the dielectric;
wherein the concentration of the germanium varies as the predetermined function of the thickness of the control gate so that a largest level of the concentration of the germanium occurs at a thickness of the control gate that is at a center of the control gate.

13. The method of claim 12, wherein the concentration of the germanium varies as the predetermined function of the thickness of the control gate so that the concentration of the germanium is symmetric about the thickness of the control gate that is at the center of the control gate.

14. A method of forming a memory cell, comprising:
varying a flow rate of reactants that form germanium according to a predetermined function of time or of a number of pulse/purge cycles to form a control gate comprising a concentration of germanium that varies as a predetermined function of a thickness of the control gate;
forming a recess in the control gate, the recess comprising a surface of the control gate at a variable depth that is governed, at least in part, by the concentration of the germanium and that varies with the thickness of the control gate;
forming a dielectric in the recess in the control gate and on the surface of the control gate at the variable depth so that a surface of the dielectric is on the surface of the control gate at the variable depth and so that the dielectric lines the recess; and
forming a charge-storage structure in the recess in the control gate that is lined with the dielectric adjacent to the dielectric;
wherein a deepest part of the recess occurs at a thickness of the control gate that is at a center of the control gate.

15. The method of claim 14, wherein the charge-storage structure comprises a floating gate.

16. The method of claim 14, further comprising forming an other dielectric adjacent to the charge-storage structure.

17. The method of claim 16, further comprising forming a semiconductor adjacent to the other dielectric.

18. The method of claim 14, wherein the memory cell is part of a vertical string of series-coupled memory cells.

19. The method of claim 14, wherein the surface of the control gate at the variable depth is a curved surface, wherein the surface of the dielectric on the surface of the control gate at the variable depth is a first curved surface of the dielectric that follows a curvature of the curved surface of the control gate, wherein a thickness of the dielectric is between the first curved surface of the dielectric and a second curved surface of the dielectric, and wherein forming the charge-storage structure in the recess in the control gate that is lined with the dielectric adjacent to the dielectric, comprises forming a curved surface of the charge-storage structure on the second curved surface of the dielectric so that the thickness of the dielectric is between the curved surface of the control gate and the curved surface of the charge-storage structure.

* * * * *